(12) United States Patent
Kiguchi et al.

(10) Patent No.: US 6,712,661 B1
(45) Date of Patent: Mar. 30, 2004

(54) METHOD FOR MANUFACTURING ELECTROLUMINESCENCE DEVICE

(75) Inventors: Hiroshi Kiguchi, Suwa (JP); Hidekazu Kobayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/554,504

(22) PCT Filed: Sep. 14, 1999

(86) PCT No.: PCT/JP99/05033

§ 371 (c)(1),
(2), (4) Date: May 16, 2000

(87) PCT Pub. No.: WO00/18193

PCT Pub. Date: Mar. 30, 2000

(30) Foreign Application Priority Data

Sep. 17, 1998 (JP) .......................................... 10-263734

(51) Int. Cl.$^7$ ................................................ H05B 33/10
(52) U.S. Cl. ............................................ 445/24; 445/58
(58) Field of Search .............................. 313/504; 445/24

(56) References Cited

U.S. PATENT DOCUMENTS

| 5,949,188 A | 9/1999 | Leising ........................ 313/505 |
| 6,140,764 A | * 10/2000 | Xu et al. ...................... 313/504 |

FOREIGN PATENT DOCUMENTS

| EP | 0 854 662 A | 7/1998 |
| EP | 0 854 662 A2 | 7/1998 |
| EP | 880303 A1 | * 11/1998 |
| JP | A-63-235901 | 9/1988 |
| JP | 152897 | 6/1991 |
| JP | A-4-212478 | 8/1992 |
| JP | A-5-230409 | 9/1993 |
| JP | A-6-203963 | 7/1994 |
| JP | 6-203963 | 7/1994 |
| JP | A-7-142169 | 6/1995 |
| JP | A-7-195682 | 8/1995 |
| JP | 8-286033 | 11/1996 |
| JP | A-9-245511 | 9/1997 |
| JP | A-10-153967 | 6/1998 |
| JP | B2 2838063 | 10/1998 |
| JP | 10-153967 | 11/1998 |
| JP | 10-338872 | 12/1998 |
| WO | WO-98/24271 A1 | * 6/1998 |

* cited by examiner

Primary Examiner—Kenneth J. Ramsey
(74) Attorney, Agent, or Firm—Oliff & Berridge, PLC (57) ABSTRACT

A manufacturing method of an electroluminescence element of is provided, which causes a light emitting layer to emit light by applying a desired voltage between an anode and a cathode, with the light emitting layer in between, and obtains visible rays by wavelength-converting the emitted light using color changing media formed in individual pixel regions. The method consists of forming a partitioning member having openings corresponding to the pixel regions on a substrate, discharging color changing media precursors into the openings using a liquid drop discharge head, and forming the color changing media by solidifying the color changing media precursors discharged onto the substrate. With this method, it is possible to discharge the color changing media precursors while adjusting the doping ratio of color changing constituents of the color changing media precursors on the spot, thus making it easier to adjust color of the color changing media.

19 Claims, 6 Drawing Sheets

METHOD FOR MANUFACTURING ELECTROLUMINESCENCE DEVICE

BACKGROUND OF THE INVENTION

1. Field of the Invention

The present invention relates to a manufacturing method of an electroluminescence (EL) element. More particularly, the invention relates to a manufacturing technique of an EL element of forming color changing media (CCM) without using a lithographic process.

2. Description of Related Art

An EL element is an organic EL element or an inorganic EL element. The organic EL element is a self-emitting type element emitting light by electrically exciting a fluorescent organic compound. This element is characterized by a high luminance, a high-speed response, a high viewing angle, face emission, and a thin thickness, and this element can emit light in multiple colors. Further, this element has a feature that it is a fully solid element emitting light through DC impression of a low voltage of a few volts, and fluctuation of properties is slight at low temperature. Since the EL element using an organic substance as a light emitting material can easily cover the entire visible range through adoption of a structure which may consist of a combination of a light emitting layer and color changing media and selection of a material forming the light emitting layer and color changing media, efforts are actively made for application to a full-color flat panel display. Known methods for full-color application of the EL element include, for example, a method of color-changing a white emission (the white emission/color changing method) and a method of color-changing a blue emission (the blue emission/color changing method).

When manufacturing a structure adopting the white emission/color changing method or the blue emission/color changing method for full-color application of the EL element, however, it is the conventional practice to form color changing media, and to perform patterning via a lithographic process into a shape corresponding to pixel regions. Formation of the color changing media on a substrate by using the lithographic process causes much waste of the color changing media material, leading to a higher manufacturing cost. The necessity of photosensitivity for the color changing media material results in a smaller range of material selection. Further problems include a high running cost of facilities necessary for the lithographic process and a larger equipment space.

Figure 6:
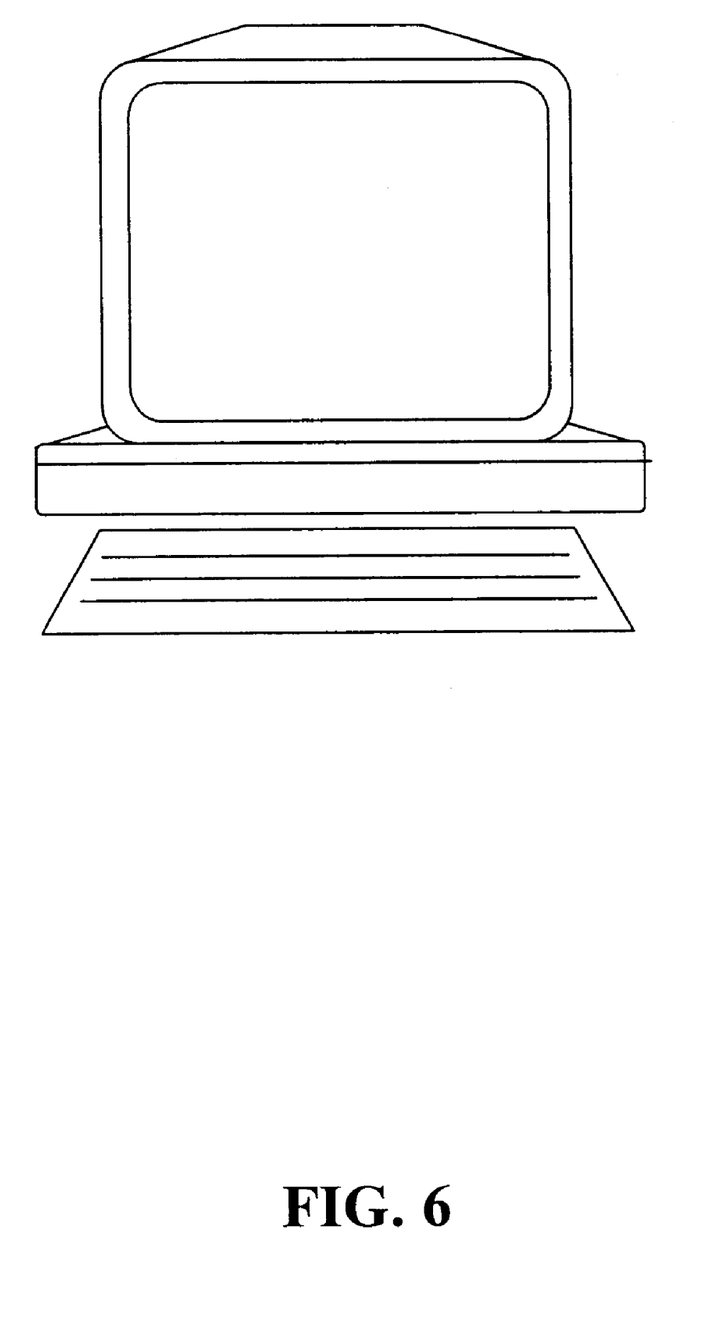
FIG. 6 is a diagram of an exemplary display used in accordance with the claimed invention.

The EL element is expected to be applicable to full-color flat panel displays in the future, as shown in FIG. 6, and the reduction of the manufacturing cost is an indispensable prerequisite.

SUMMARY OF THE INVENTION

The present invention was developed in view of the aforementioned problems and has an object to provide a method of manufacturing an electroluminescence element which may consist of a light emitting layer and color changing media for manufacturing color changing media without using a lithographic process, and to provide a high-performance electroluminescence element manufacture by this method.

A first manufacturing method of an electroluminescence element of the present invention may consist of the steps of causing a light emitting layer to emit light by applying a desired voltage between an anode and a cathode, with the light emitting layer in between, and obtaining visible rays by wavelength-converting the emitted light using color changing media formed in individual pixel regions. This method may further consist of a first step of forming partitioning members having openings corresponding to the pixel regions on a substrate, a second step of discharging a color changing media precursor into the openings using a liquid discharge head, and a third step of forming color changing media by solidifying the color changing media precursor discharged onto the substrate.

Particularly, in the above-mentioned first method, the second step should preferably be a step of discharging the color changing media while adjusting the doping ratio of color changing constituents of the color changing media.

The color changing media precursor is a precursor of color changing media selected from the group consisting of red color changing media, green color changing media and blue color changing media. In this case, the precursor of the red color changing media should preferably have a chemical composition which may consist of any one of a cyanine-based pigment, a pyridine-based pigment, a xanthene-based pigment and an oxadine-based pigment.

The precursor of the red color changing media may adopt a chemical composition prepared by dispersing: (a) a rhodamine-based fluorescent pigment, and (b) a fluorescent pigment, which absorbs rays in the blue region and induces energy transfer or re-absorption to the rhodamine-based fluorescent pigment, into a light transmitting medium. The precursor of the green color changing media may have a chemical composition which may consist of, for example, a stilbene-based compound and a coumarin-based compound. The precursor of the blue color changing media may have a chemical composition which may consist of, for example, a coumarin pigment.

In the aforementioned first method, a light emitting layer should preferably be formed by coating or by vapor deposition so as to form an upper layer relative to the color changing media after the above-mentioned process of forming the color changing media (the third step).

A second manufacturing method of an electroluminescence element of the invention may consist of the steps of causing a light emitting layer to emit light by applying a desired voltage between an anode and a cathode with the light emitting layer in between, and obtaining visible rays by wavelength-converting the emitted light using color changing media formed in individual pixel regions. This method may further consist of a first step of forming anodes at positions corresponding to the pixel regions on a substrate, a second step of forming partitioning members which partition between the anodes, and have openings at positions corresponding to the pixel regions, a third step of discharging a precursor of the color changing media into the openings using a liquid drop discharge head, and filling the anodes with the precursor of the color changing media, and a fourth step of forming the color changing media by solidifying the precursor of the color changing media.

Particularly, in the above-mentioned second method, the third step should preferably be a step of discharging the precursor of the color changing media while adjusting the doping ratio of color changing constituents of the precursor of the color changing media.

The precursor of the color changing media is conductive and is a precursor of color changing media selected from a group consisting of red color changing media, green color changing media and blue color changing media.

In the aforementioned second method, a light emitting layer should preferably be formed by coating or by vapor deposition so as to form an upper layer relative to the color changing media after the above-mentioned process of forming the color changing media (the fourth step).

The contact angle between a material composing a nozzle surface of the liquid drop discharge head and the precursor of the color changing media should preferably be within a range from 30 to 170 deg. The precursor of the color changing media should preferably have a viscosity within a range from 1 to 20 mPas. Further, the precursor of the color changing media should preferably have a surface tension within a range from 20 to 70 dynes/cm. The liquid drop discharge head should preferably comprise a pressurizing chamber substrate having a pressurizing chamber which stores the color changing media precursor and a piezoelectric thin film element attached to a position permitting application of a pressure to the pressurizing chamber.

Further, according to the invention, the electroluminescence element for causing a light emitting layer to emit light by applying a desired voltage between an anode and a cathode arranged with the light emitting layer in between, and obtaining visible rays by wavelength-converting the emitted light with color changing media formed for each of pixel regions, may consist of the color changing media between the anode and the cathode. The electroluminescence element has, for example, a lamination structure comprising a cathode, a light emitting layer, color changing media and an anode. Particularly, the color changing media is conductive and is color changing media selected from the group consisting of red color changing media, green color changing media and blue color changing media.

BRIEF DESCRIPTION OF THE DRAWINGS

FIGS. 2(A)–3(F) are sectional views illustrating the manufacturing method of the EL element of second embodiment of the invention in a sequence of steps;

DETAILED DESCRIPTION OF THE EMBODIMENTS

Embodiments of the present invention will now be described with reference to the drawings.

First Embodiment

The structure of the EL element and the manufacturing method thereof of the first embodiment will be described with reference to FIGS. 1(A)–(C).

Figure 1:
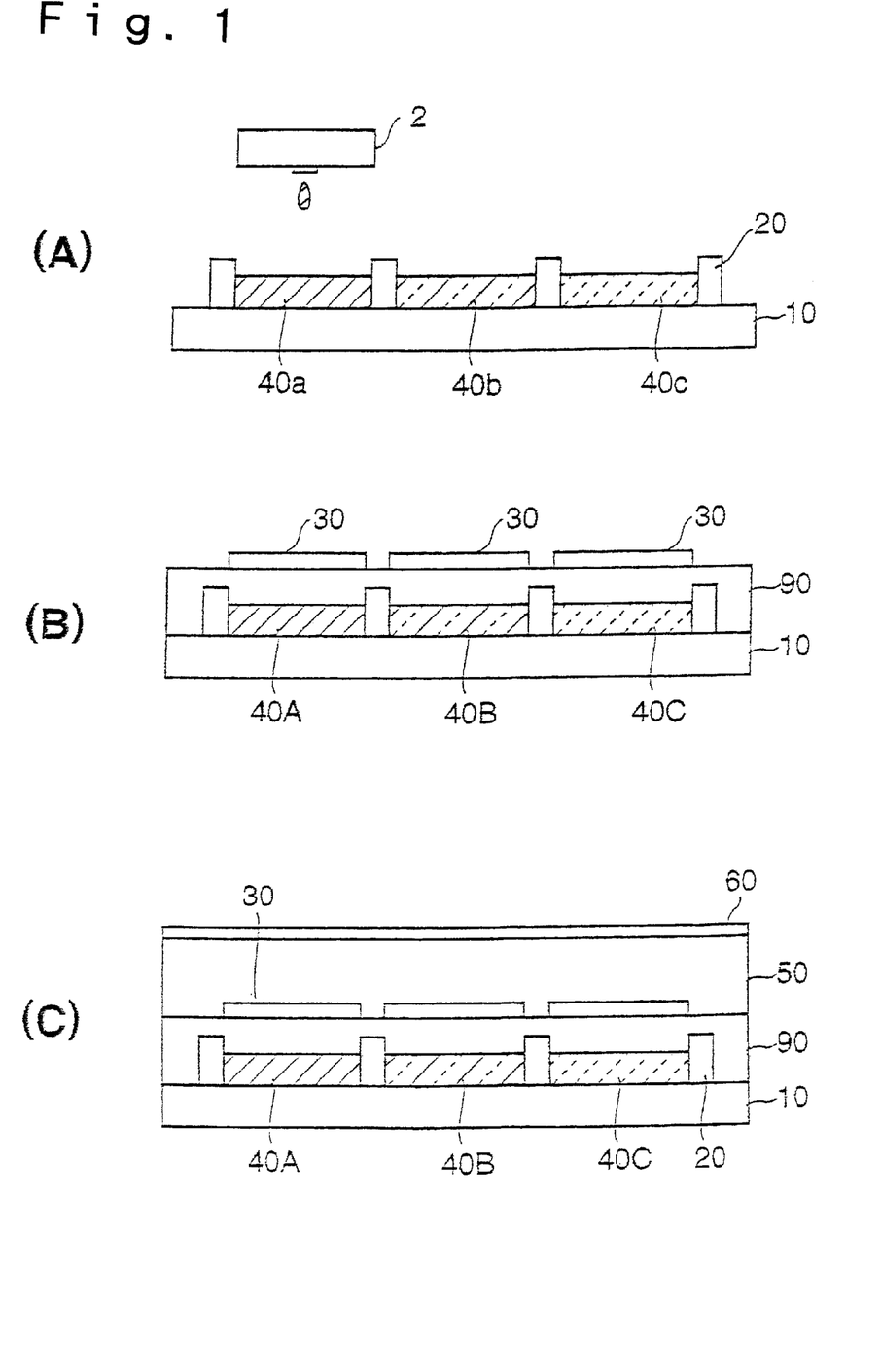
FIGS. 1(A)–(C) are sectional views illustrating the manufacturing method of the EL element of first embodiment of the present invention in a sequence of steps.
Figure 2:
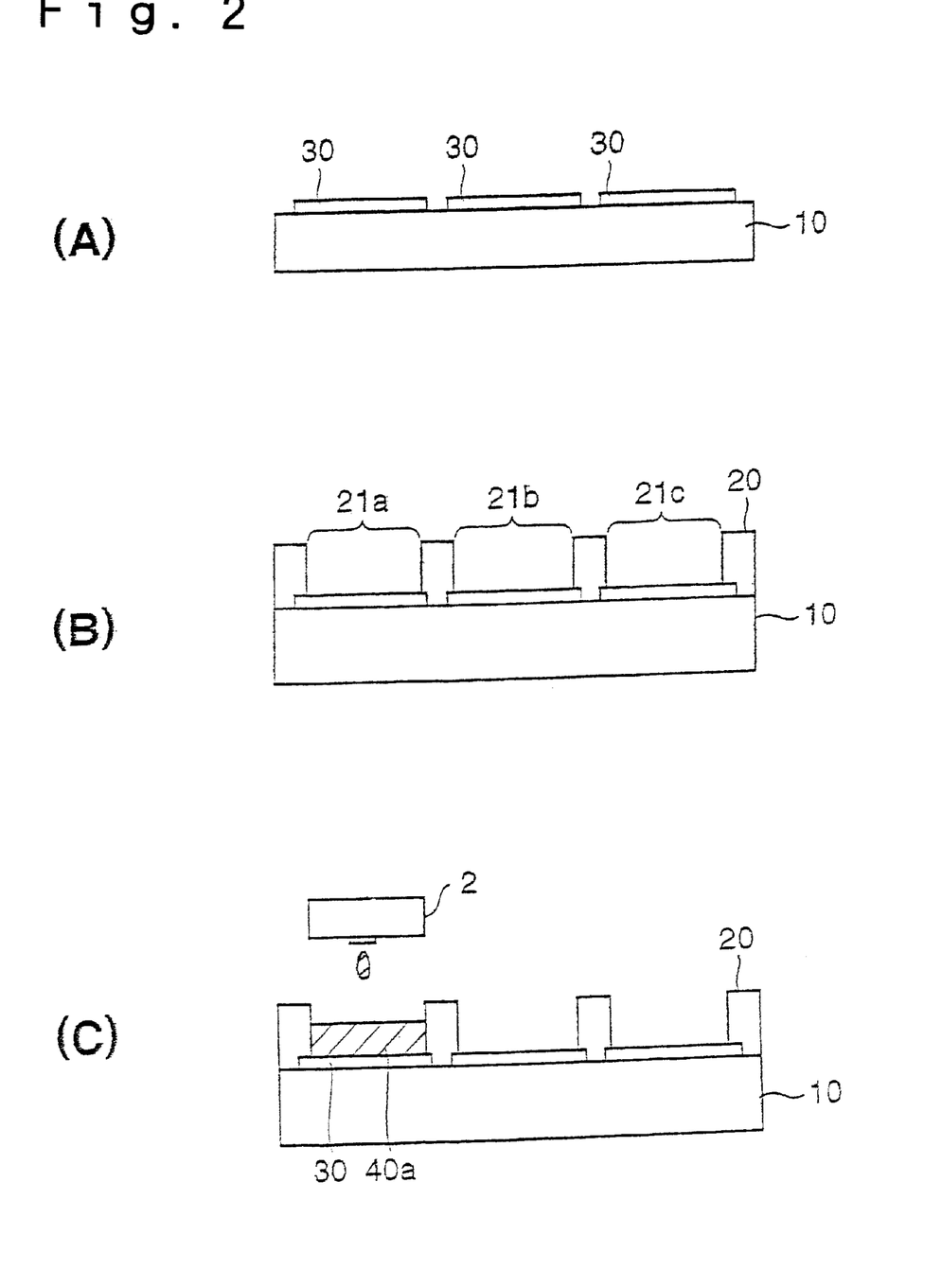
Figure 3:
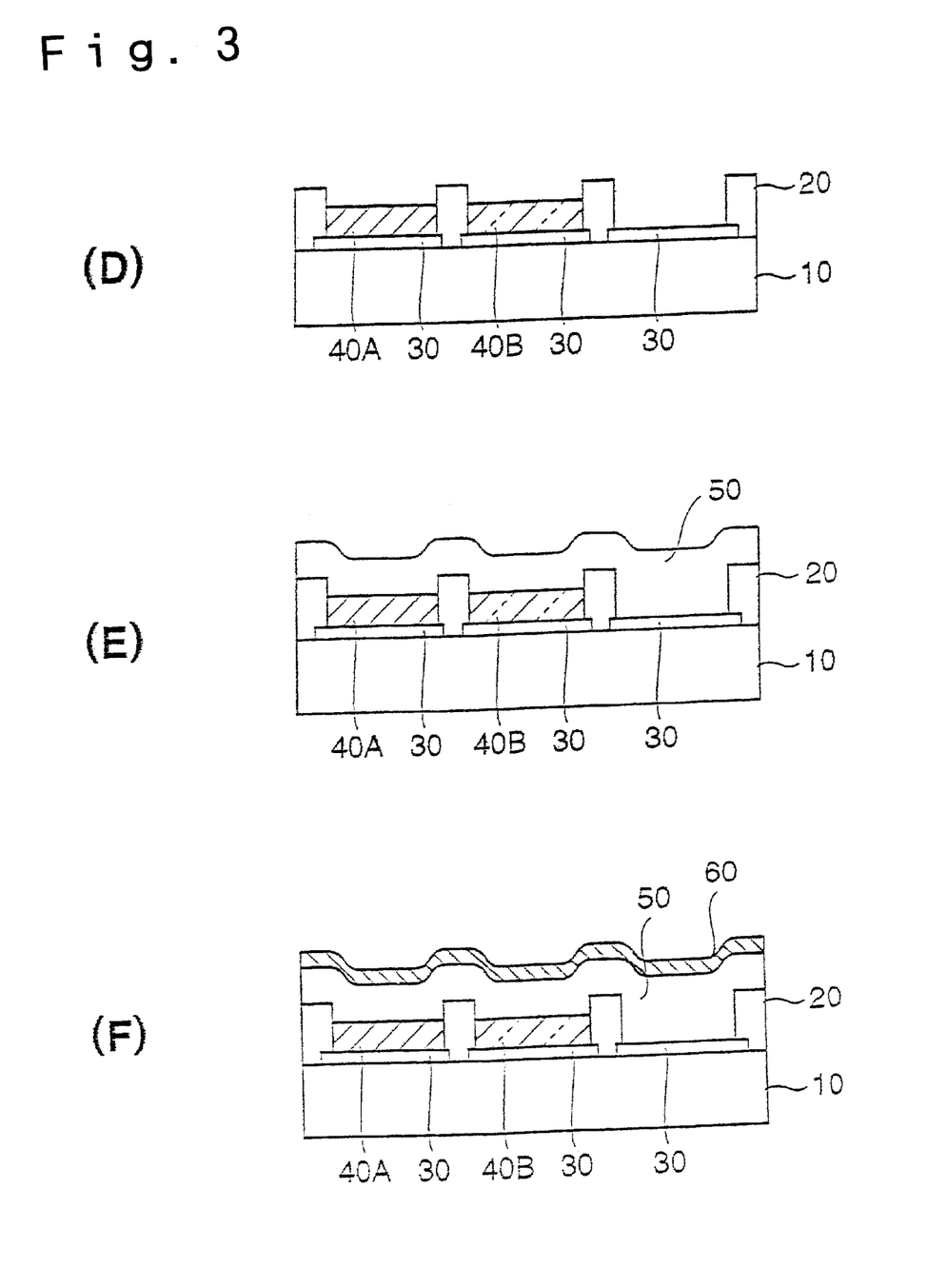

FIG. 1(C) illustrates the structure of the EL element of the blue emission/color changing type. Red color changing media 40A, green color changing media 40B, and blue color changing media 40C are formed on a substrate 10, and covered with a light-transmissive protection film 90. Anodes 30 made of ITO (indium thin oxide) are formed at positions corresponding to the color changing media 40A to 40C are formed on the protecting film 90. A blue light from recombination of electrons and holes in a light emitting layer 50 by applying a DC voltage between an anode 30 and a cathode 60 can be obtained. R, G and B light sources or images are obtained by converting the blue light into red (R), green (G) and blue (B) by means of the color changing media 40A to 40C.

When blue emission of the light emitting layer 50 sufficiently satisfies the demand, the blue color changing media 40C is not necessary.

(Manufacturing Process of EL Element)

The manufacturing process of the EL element of this embodiment will now be described with reference to FIGS. 1(A)–(C).

Color Changing Media Precursor Discharge Process (FIG. 1(A))

This is a process of discharging the color changing media precursor onto the glass substrate 10. As the glass substrate 10, for example, a flat transparent glass substrate having a size of about 300 mm×300 mm×0.7 mm is prepared. This transparent glass substrate should preferably withstand a heat of 350° C., be resistant to chemicals such as acids and alkalies, and be capable of being mass-produced.

A partitioning member (bank) 20 is first formed on the glass substrate 10 to facilitate forming color changing media at a desired position in a desired shape on the glass substrate 10. The partitioning member 20 has a shape provided with an opening corresponding to a pixel region. The material for this partitioning member 20 is an acrylic resin or a polyimide resin. The partitioning member 20 has a height within a range of from 0.5 to 2 mm, which can be adjusted as required. It is recommendable to blend a fluororesin or a fluorine-based surfactant with this partitioning member 20 or plasma-treat the partitioning member 20 with $CF_4$. This reduces wettability with ink, thus permitting prevention of ink mixing on the partitioning member 20.

The color changing media precursor is supplied to the openings between the partitioning members 20 through discharge. Discharge of the color changing media precursor is accomplished by means of a liquid drop discharge head 2. The liquid drop discharge head 2 may be of the piezo-jet type or of a type of discharging by the use of production of bubbles caused by generation of heat. In the piezo-jet type, the head 2 has a pressurizing chamber substrate having a pressurizing chamber which may consist of a nozzle plate and a piezo thin film element. By driving the piezo thin film element, a fluid (the color changing media precursor in this case) filling the pressurizing chamber is pressurized in a moment and discharged through the nozzle selectively into a prescribed region. In the type of discharging which uses the production of bubbles caused by heat generation, the head 2 has a heater is provided in the pressurizing chamber communicating with the nozzle. The fluid near the nozzle is brought to a boil by increasing temperature of this heater, and the fluid is discharged under the effect of volumetric expansion by bubbles produced at this point. The piezo jet type is preferable because there is no change in the color changing media precursor caused by heating.

First, as shown in FIGS. 1(A)–(C), the red color changing media precursor 40a is discharged at a position corresponding to the pixel region (region corresponding to red pixels) on the substrate 10. A material containing (a) a rhodamine-based fluorescent pigment, and (b) a fluorescent pigment which absorbs the blue region, and induces energy transfer or re-absorption to the rhodamine-based fluorescent pigment, is used as the red color changing media precursor.

The fluorescent pigment should preferably be capable of absorbing blue rays of up to 520 nm, and have absorbability of at least OD 1.0 for a range of from 420 to 490 nm. The rhodamine-based fluorescent pigment should preferably contain a naphthalimide fluorescent pigment or a coumarin-based fluorescent pigment. With this chemical composition, it is possible to change an emitted color of the blue emitting layer into red at a high efficiency of at least 33%.

Then, the precursor 40b of the green color changing media is discharged to a position corresponding to the pixel region (region corresponding to green pixels) on the substrate 10. The precursor 40b of the green color changing media should preferably contain a pigment of a stilbene-based compound or a coumarin-based compound.

As required, the precursor 40c of the blue color changing media is discharged to a position corresponding to the pixel region on the substrate 10. The precursor 40c of the blue color changing media should preferably contain a coumarin-based pigment. When the colored light (blue) of the emitting layer 50 sufficiently satisfies the demand, this process is not necessary.

According to the above-mentioned method, it is possible to discharge the precursors of the color changing media while adjusting the doping ratio of the color changing constituents of the color changing media, thus making it easier to perform color coordination.

Physical properties (contact angle, viscosity and surface tension) of these color changing media precursors should preferably have the following values.

(1) Contact Angle

The contact angle between the material composing the nozzle surface of the liquid drop discharge head and the color changing media precursor should preferably be set within a range of from 30 to 170 deg. The contact angle can be adjusted by appropriately increasing or decreasing the amount of water, NMP, DMI, ethanol, or diethyleneglycol, and should preferably be set particularly within a range of from 35 to 65 deg.

When the color changing media precursor has a contact angle within this range relative to the nozzle surface of the discharge head, it is possible to inhibit occurrence of a flight bend upon discharging, thus permitting accurate discharge control. With a contact angle of under 30 deg, the color changing media precursor has an increased wettability on the nozzle surface, and upon discharging the color changing media precursor, the precursor may asymmetrically adhere around the nozzle hole. An attraction force acts between the color changing media precursor adhering to the nozzle hole and the color changing media precursor discharged. As a result, the color changing media precursor is discharged under a non-uniform force, resulting in occurrence of a flight bend, and this may make it impossible to hit the target position. This leads to a high flight bend frequency. With a contact angle of over 170 deg, on the other hand, interaction between the color changing media precursor and the nozzle hole becomes minimum, leading to an unstable shape of meniscus at the nozzle tip. It may become consequently difficult to control the amount of discharge of the color changing media precursor and the discharge timing.

The term "flight bend" as used in the invention means occurrence of a shift of the hitting position of the color changing media precursor of larger than 30 mm from the target position when discharging the color changing media precursor through the nozzle hole. The flight bend frequency means the time before occurrence of a flight bend when continuously discharging the same at an oscillation frequency of, for example, 14.4 kHz of the piezo thin film element of the liquid drop discharge head.

(2) Viscosity

The color changing media precursor should preferably have a viscosity within a range of from 1 to 20 mPas. The viscosity can be adjusted by appropriately changing the amount of glycerine or ethylene glycol, and should preferably be particularly within a range of from 2 to 4 mPas.

With a viscosity of the color changing media precursor of under 1 mPa, the meniscus of the color changing media at the nozzle hole is not stable, and this may make it difficult to perform discharge control of the precursor. With a viscosity of over 20 mPas, on the other hand, the color changing media precursor cannot be smoothly discharged from the nozzle hole, and discharge of the color changing media precursor becomes difficult unless specifications for the liquid drop discharge head are modified, for example, to enlarge the nozzle hole. Further, with a high viscosity, solid constituents of the color changing media precursor are easily precipitated, resulting in a higher frequency of nozzle hole clogging.

(3) Surface Tension

The surface tension of the color changing media precursor should preferably be set within a range of from 20 to 70 dyne/cm. The surface tension can be adjusted by appropriately changing the amount of water, NMP, DMI, ethanol, diethyleneglycol, glycerine, xylene, tetralyne or a mixture of these solvents, and should preferably be set particularly within a range of from 25 to 60 dyne/cm.

By setting the surface tension within the above-mentioned range, it is possible to inhibit occurrence of a flight bend and reduce the flight bend frequency, as in the aforementioned case of the contact angle. With a surface tension of over 70 dyne/cm, the shape of meniscus at the nozzle tip is not stable, and this may make it difficult to perform control of the amount of discharge of the color changing media and the discharge timing. With a surface tension of under 20 dyne/cm, the color changing media precursor has an increased wettability to the material forming the nozzle surface, and this may result in occurrence of a flight bend and a higher flight bend frequency as in the above-mentioned case of contact angle.

The flight bend occurs mainly when wettability of the nozzle hole is non-uniform, or when clogging is caused by adhesion of solid constituents of the color changing media precursor, and can be eliminated by cleaning the liquid drop discharge head (hereinafter referred to as "flashing"). Flashing is usually to impart such a function to the liquid drop discharge head mechanism to prevent clogging or flight bend by modifying the liquid drop discharge head mechanism, and designed to forcedly discharge a prescribed amount of color changing media precursor when discharge of the color changing media precursor is discontinued for a certain period of time (hereinafter referred to as the "flashing time"). The flashing time means a period of time from the moment when the nozzle not discharging the color changing media precursor dries up to the occurrence of a flight bend, and serves therefore as an indicator showing properties of the color changing media. A longer flashing time is more suitable for the ink jet printing technique, and permits stable discharge of the color changing media precursor for a long period of time.

Therefore, when the color changing media precursor has the above-mentioned values of physical properties, it is possible to extend the flashing time and to maintain a fresh state of the interface between the open air and the color changing media precursor. Because the density of dots of the discharged color changing media precursor can be kept uniform irrespective of the discharge time point, it is possible to prevent the occurrence of color blurs of the color changing media. Further, an excellent straight flight property upon discharge of the precursor makes it easier to perform control of the liquid drop discharge head, and adopt a simpler structure of the manufacturing equipment.

The aforementioned ranges of physical properties are preferable ranges under a temperature condition of 20° C.

After supplying the color changing media precursor selectively onto the substrate 10 by discharging, the color changing media precursor is solidified through a heat treatment. The solvent constituents are evaporated by this process, giving color changing media 40A, 40B and 40C.

Process Forming Protecting Film and Anode (FIG. 1(B))

This is a process of forming a protecting film 90 and an anode 30 on the substrate 10.

The protecting film 90 is formed from a light-transmissive material, such as an acrylic resin by a film forming method, such as the spin coat method, the bar coat method, the printing method or the ink jet method. The film has a thickness of 2 mm. Then, an anode 30 is formed on the surface of the protecting film 90. A light-transmissive conductive material such as ITO, or a composite oxide of indium oxide and zinc oxide is used for forming the anode. Among others, ITO has a large work function, and the hole serves as a positive pole for injection in to the blue emitting layer, thus having properties preferable as an anode. In this process, ITO is formed into a film having a thickness of 0.15 mm by sputtering, and patterned into a shape corresponding to the color changing media 40A to 40C.

Process Forming Blue Emitting Layer and Cathode (FIG. 1(C))

This is a process of forming a blue emitting layer 50, and a cathode 60 on the protecting film 90, so as to cover the anode 30. As light emitting materials for an organic EL element, there are available a pigment molecule which is a low molecule and a conductive polymer which is a conjugated polymer. A low molecular material is used for forming an organic thin film mainly by vapor deposition, and a polymer-based material, by the spin coat method. Although not shown in FIGS. 1(A)–(C), a double-hetero structure may be built by forming a hole transfer layer and an electron transfer layer with the blue emitting layer 50 in between.

More specifically, the film forming process is as follows. First, 200 mg 4-4'bis (N-phenyl-N(3-methylphenyl)amino) biphenol (TPD) are put in a resistance-heating board made of molybdenum, 200 mg 4-4'bis (2,2-diphenylvinyl) biphenyl (DPVBi) and tris (8-quinolinol) aluminum (Alg) are put in another resistance-heating board made of molybdenum, and the interior of a vacuum chamber is pressure-reduced. The board containing TPD is heated to a temperature of 215 to 220° C. to deposit TPD onto the substrate at a vapor depositing rate within a range of from 0.1 to 0.3 nm/s, and thus to form a hole transfer layer having a thickness of 60 nm. At this point, the substrate is at the room temperature. Then, DPVBi is deposited under conditions including a board temperature of 250° C. and a vapor depositing rate of from 0.1 to 0.2 nm/s to form a blue emitting layer 50 having a thickness of 40 nm. Then, Alg is further deposited under conditions including a board temperature of 250° C. and a vapor depositing rate of from 0.1 to 0.3 nm/s to form an electron transfer layer having thickness of 20 nm.

Other applicable materials for the blue emitting layer 50 include pigment molecules of anthracene, $Zn(OXZ)_2$, PPCP, distilbenzene (DSB), and derivatives thereof (PESB). These materials can be formed into a film by the organic molecular beam deposition (OMDB) method. According to this method, it is possible to control the film thickness to a molecular order. The material for the blue emitting layer 50 is not limited to an organic thin film, but it may be a thin film made of an inorganic material, such as strontium sulfide added with cerium. The inorganic thin film should preferably have a high insulation pressure resistance, an emitting center having an appropriate emission color, and be free from impurities or defects impairing emission.

Then, a cathode 60 is formed on the blue emitting layer 50. Preferable materials for the cathode include ones having a small work function, particularly alkaline metals and alkali earth metals. Among others, for example, alloys such as Mg/Ag and Al/Li are suitable. More specifically, the film is formed as follows. First, 0.5 g silver wire are put in a tungsten basket, and 1 g magnesium ribbon is put in a board made of molybdenum. Pressure in a vacuum chamber is reduced, and silver (vapor depositing rate: 0.1 nm/s) and magnesium (vapor depositing rate: 0.8 nm/s) are simultaneously vapor-deposited to form the cathode 60.

The EL element of the blue emission/color changing type is thus completed through the aforementioned steps.

According to this embodiment, it is possible to form color changing media without the use of a lithographic process, and hence to reduce the manufacturing cost of an EL element provided with color changing media. Because it is not necessary to impart photosensitivity to the color changing media, there is available an advantage of having a wider range of material selection. Since the color changing media is formed by discharge color changing media precursor by the use of a liquid drop discharge head, the doping ration of the constituents of the color changing media precursor can be appropriately adjusted on the spot. This facilitates adjustment of the pigment constituents of the color changing media. This embodiment is applicable also to a white emission/color changing type EL element.

Second Embodiment

The structure of an EL element and the manufacturing method thereof of the second embodiment will now be described with reference to FIGS. 2(A)–3(F).

(Structure of EL Element)

The structure of the EL element will be described with reference to FIG. 3(F). This EL element is of the blue emission/color changing type. A matrix-shaped partitioning member 20 is formed on a glass substrate 10 and partitions pixel regions (light-transmission regions) for the formation of color changing media 40A and 40B. By appropriately selecting a material for the partitioning member 20, the member can simultaneously serve to shield light. The color changing media 40A is red color changing media, and the color changing media 40B is green color changing media. An anode 30 which may consist of ITO is formed in each of the pixel regions. By applying a voltage between the anode and the cathode 60, electrons injected from the cathode 60 encounter the hole injected from the anode 30 in the organic substance (light emitting layer), thus forming an exciton which is a hole-electron pair. A blue electroluminescence is obtained from emitting re-combination of this exciton. R, G and B three primary color light sources (images) are available by color-changing this blue light with the color changing media 40A for the red pixels, with the color changing media 40B for the green pixels, and the direct use of the blue light from the light emitting layer 50 for the blue pixels. While the blue color changing media is not used as color changing media but a blue emission is directly used in FIGS. 3(D)–(F), blue color changing media may be provided when a necessary blue light is not available from emission from the blue emitting layer.

(Manufacturing Process of EL Element)

The manufacturing process of an EL element of this embodiment will be described with reference to FIGS. 2(A)–3(F).

Anode Forming Process (FIG. 2(A))

An anode 30 is formed on the substrate 10. For the glass substrate 10, it suffices to use one similar to that in first embodiment. The material for the anode should be a light-transmissive conductive material such as ITO, or a composite oxide of indium oxide and zinc oxide. In this process, ITO is formed by sputtering into a film having a thickness of 0.15 mm, and patterned by a lithographic process into a shape corresponding to the pixel region.

Partitioning Member Forming Process (FIG. 2(B))

A partitioning member 20 which partition anodes and has an opening to the pixel region is formed. Various chemical compositions are applicable for the partitioning member 20. In this embodiment, the description covers a case where the partitioning member 20 having a light-shielding property serves as a black matrix. The partitioning member 20 may be made of any material appropriately selected so far as it has a satisfactory durability. More specifically, applicable materials include a negative type resin black made by Fuji Hunt Co., a resist HRB-#01 for high-insulation black matrix made by Toppan Printing Co., and a resin black made by Nihon Gosei Gomu Co., and other black resins dissolved in an organic solvent. These resins are formed into a film having a prescribed thickness of 0.5 to 2.5 mm by the spin coat method, the dipping method, the spray coat method, the roll coat method, or the bar coat method.

Apart from these resins, applicable materials include resin blacks prepared by dispersing metal chromium, carbon or titanium in a photoresist, and a double-layer structure of nickel, chromium and chromium oxide. In this case, a partitioning member 20 is formed by sputtering or vapor deposition. Then, a resist (not shown) is coated onto the partitioning, and exposed and developed into a desired pattern. With this resist as a mask, the partitioning member 20 is etched. The partitioning member 20 partitioning into a matrix shape is formed through these processes. The partitioning member 20 is provided with openings 21a to 21c formed in agreement with positions of the pixel regions.

The partitioning member 20 may be formed by the printing method. In this case, it suffices to directly coat the organic material in a matrix shape by the use of relief, intaglio or flat typesetting.

Color Changing Media Precursor Discharge Process (FIG. 2(C))

This is a process of discharging the liquid color changing media precursor to the openings 21a to 21c through the liquid drop discharge head 2. FIG. 2(C) illustrates the red color changing media precursor 40a being discharged to the opening 21a. In this embodiment, in which the color changing media precursor is to be discharged onto the anode 30, a conductive material is used for the color changing media precursor. More specifically, the red color changing media precursor may have a chemical composition prepared by mixing a transparent conductive material with a cyanine-based pigment, a pyridine-based pigment, a xanthene-based pigment, or an oxadine-based pigment; the green color changing media precursor may have a chemical composition prepared by mixing a transparent conductive material with a stilbene-based compound and a coumarin-based compound.

When using the blue color changing media, the precursor may have a chemical composition prepared by mixing a transparent conductive material with a coumarin pigment. Applicable transparent conductive materials include an ITO alkoxyd solution, a xylene dispersed solution of ITO particles, and a toluene dispersed solution of a composite oxide particles of indium oxide and zinc oxide.

When the blue light of the blue emitting layer sufficiently satisfies the demand, however, the discharge process of the blue color changing media precursor is not necessary.

Color Changing Media Precursor Solidification Process (FIG. 3(D))

This is a process solidifying the color changing media precursor discharged into the openings 21a and 21b through a heating treatment. This process causes evaporation of the solvent constituents, and gives color changing media 40A and 40B.

Blue Emitting Layer Forming Process (FIG. 3(E))

This is a process of forming a blue emitting layer 50 so as to cover the color changing media 40A and 40B. As light emitting materials for an organic EL, there are available pigment molecules which are low molecules and conductive polymers which are conjugated polymers. An organic thin film can be formed from a low-molecule material mainly by vapor deposition, and from a polymer material, by spin coat method. Although not shown in FIG. 3(E), a double-hetero structure may be formed by forming a hole transfer layer and an electron transfer layer with the blue emitting layer in between. The film forming method in detail is the same as in first embodiment.

Cathode Forming Process (FIG. 3(F))

As cathode 60 is formed on the blue emitting layer 50. Preferable materials for the cathode include alkaline metals and alkali earth metals, such as Mg/Ag and Al/Li alloys. The film forming method in detail is the same as in first embodiment. Upon forming the cathode 60, the blue emission/color changing type EL element is completed.

The EL element manufactured in this embodiment has a structure in which, particularly as shown in FIG. 3(F), a layer formed by a discharging method with the used of the liquid drop discharge head between the anode and the cathode (i.e., color changing media) and a layer formed by coating or vapor deposition (i.e., the blue emitting layer) are laminated for some pixels (for example, the red pixels and the green pixels), and as required, a layer formed by the discharging method is not provided between the anode and the cathode, but only a layer formed by coating or vapor deposition (i.e., the blue emitting layer) is provided for some other pixels (for example, the blue pixels).

According to this embodiment, in which the color changing media itself is conductive, it is possible to provide an EL element having color changing media located between the anode and the blue emitting layer. Because color changing media can be formed without using a lithographic process, the manufacturing cost of EL element can be reduced. Absence of the necessity to impart photosensitivity to the color changing media provides an advantage of a wider range of material selection. Since the color changing media is formed by discharging the color changing media precursor by the use of the liquid discharge head, it is possible to appropriately adjust the doping ration of the constituents of the color changing media precursor on the spot, thus facilitating adjustment of the pigment constituents of the color changing media.

Third Embodiment

The structure of an EL element and the manufacturing method of the third embodiment thereof will be described with reference to FIGS. 1(A)–(C).

(Structure of EL Element)

Figure 4:
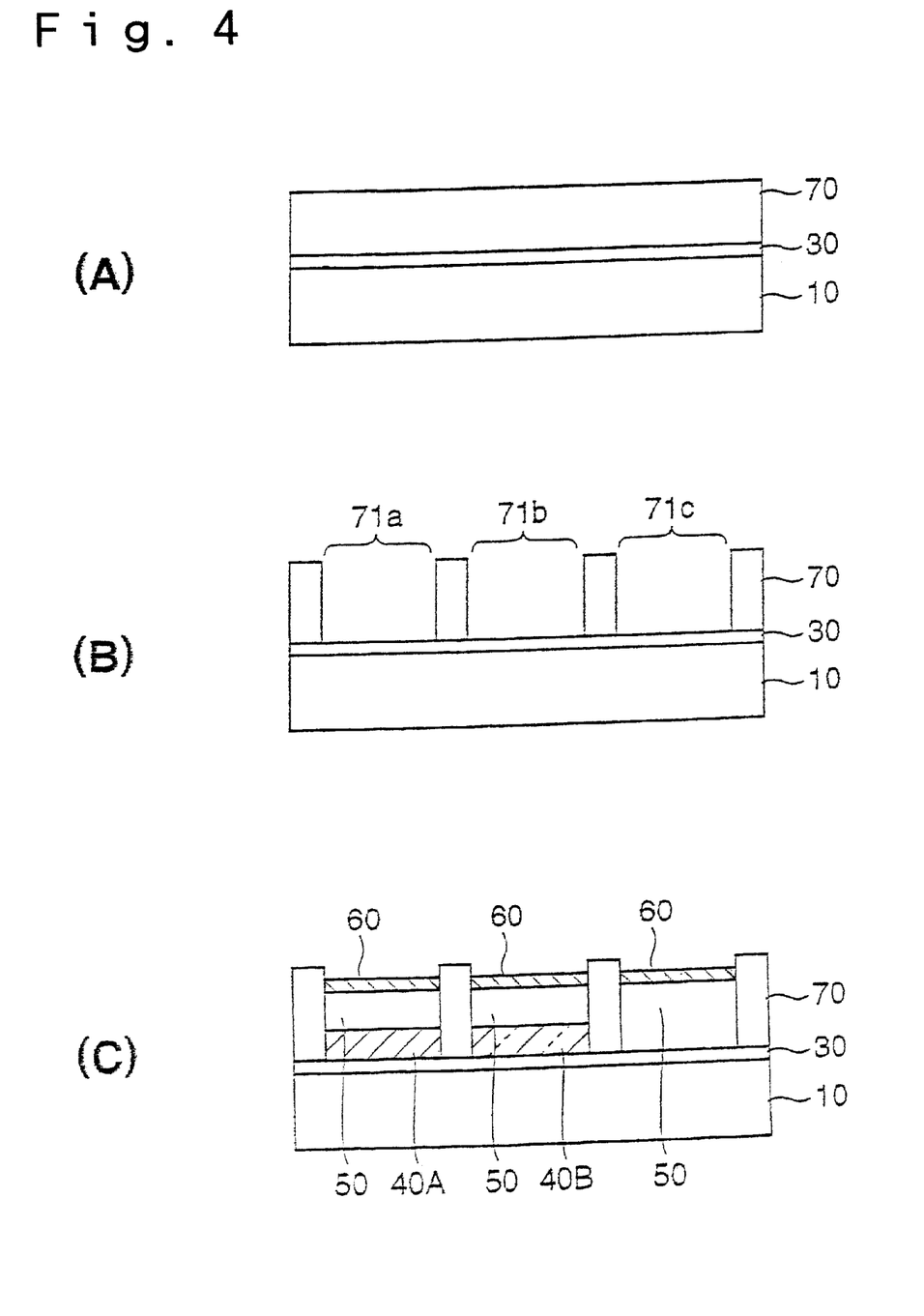
FIG. 4 is a sectional view illustrating the manufacturing method of the EL element of the third embodiment of the invention in a sequence of steps.

The structure of the EL element will be described with reference to FIG. 4(C). In this EL element, a partitioning member 70 which may consist of a resist partitions individual pixel regions, and an anode 30 formed on the entire surface of a substrate 10, serves as a common electrode. For example, red color changing media 40A, a blue emitting layer 50 and a cathode 60 are sequentially laminated in the red pixel region.

(Manufacturing Process of EL Element)

The manufacturing process of the EL element will be described with reference to FIGS. 4(A)–(C). As the anode 30, a resist 70 is spin-coated on the glass substrate 10 having an ITO film formed on the surface thereof (FIG. 4(A)). The resist 70 is patterned in accordance with the pixel region and openings 71a to 71c are formed (FIG. 4(B)). The color changing media precursor is discharged into the openings 71a and 71b through a liquid drop discharge head, and the discharged color changing media precursor is solidified to form color changing media 40A and 40B. Then, a blue emitting layer 50 and a cathode 60 are formed in the openings 71a to 71c. In this case, the color changing media precursor should be conductive. Specifically, it suffices to use the same constituents (materials) as in the second embodiment.

According to this embodiment, the resist 70 plays the role of electrically insulating the individual cathodes 60. Because it is possible to pattern the cathode 60 in agreement with the pixel region without using a lithographic process or an etching process, the manufacturing process can be simplified, thus permitting reduction of the manufacturing cost.

Fourth Embodiment

The structure of an EL element and the manufacturing method thereof will be described with reference to FIGS. 5(A)–(D).

(Structure of EL Element)

Figure 5:
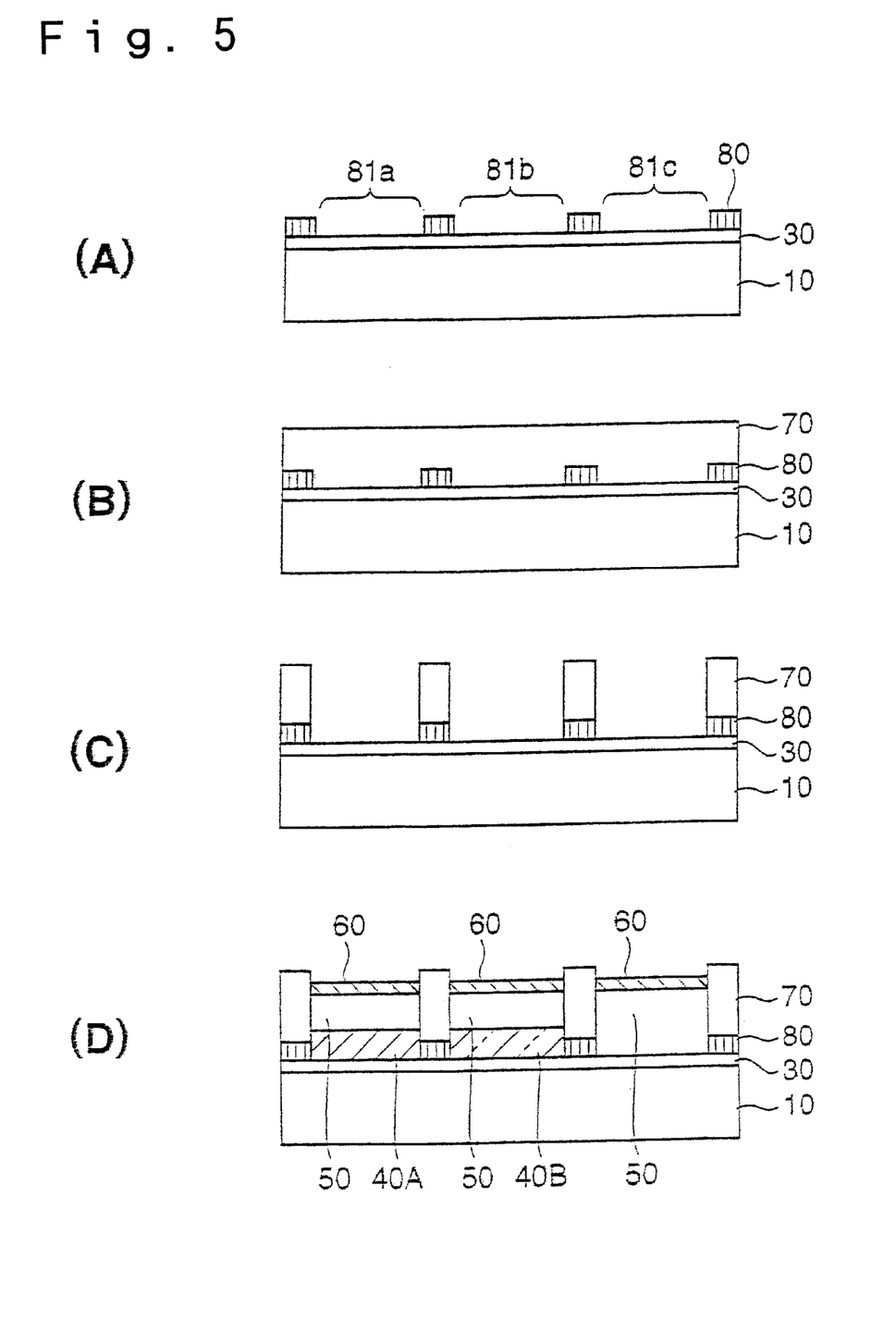
FIG. 5 is a sectional view illustrating the manufacturing method of the EL element of fourth embodiment of the invention in a sequence of steps.

The structure of the EL element will be described with reference to FIG. 5(D). This EL element is an improvement over that of the third embodiment. An insulating film 80 is formed on the lower part of the partitioning member 70. This insulating film 80 serves to cut leak current between the cathode 60 and the anode 30 to prevent short-circuiting of the element. This improves the reliability of the EL element.

(Manufacturing Process of EL Element)

The manufacturing process of the EL element will be described with reference to FIGS. 5(A)–(D). An oxide film 80 is formed as an anode 30 on a substrate 10 having an ITO thin film formed on the surface thereof. There is no particular limitation on the kind of the oxide film 80 so far as it is an insulating thin film: it may be a silicon diode film, a zirconium oxide film, a tantalum oxide film, a silicon nitride film, or an aluminum oxide film. The insulating film 80 is patterned so as to match with the pixel regions to form openings 81a to 81c (FIG. 5(A)). A resist 70 is spin-coated over the entire surface of the substrate 10 (FIG. 5(B)). This resist 70 is patterned in accordance wit the insulating film 80 to leave the resist 70 only on the insulating film 80 (FIG. 5(C)). A color changing media precursor is discharged into the openings 81a and 81b through a liquid drop discharge head, and solidified to form color changing media 40A and 40B. Then, a blue emitting layer 50 and a cathode 60 are sequentially formed in the openings 81a to 81c (FIG. 5(D)). In this case also, the color changing media precursor should be conductive. More specifically, it suffices to use the same constituents as in second embodiment.

According to this embodiment, the insulating film 80 cuts leakage current between the cathode 60 and the anode 30, thus serving to prevent short-circuiting of the element. This improves the reliability of the EL element. Patterning the resist 70 into a wider narrower than the width of the oxide film 80 structurally improves insulation between the anode 30 and the cathode 60, and is more effective for the prevention of short-circuiting.

According to the present invention, as described above in detail, in which color changing media can be formed without using a lithographic process, it is possible to reduce the manufacturing cost of the electroluminescence element. Because it is not necessary to impart photosensitivity to the color changing media, there is available a wider range of material selection. Further, since the color changing media precursor is discharged through the liquid drop discharge head and solidified to obtain color changing media, it is possible to easily adjust the doping ration of constituents of the color changing media precursor on the spot to a value the most suitable for color changing properties.

What is claimed is:

1. A manufacturing method of an electroluminescence element comprising:

forming partitioning members having a plurality of pixel openings so as to correspond to pixel regions of the electroluminescence element;

discharging a fluid including a color changing constituent toward each of said openings with a liquid drop discharge head;

solidifying the fluid to form a color changing media in each of the plurality of pixel openings; and forming a light emitting layer that causes a light, a wavelength of the light being converted by the color changing media;

wherein the color changing media and the light emitting layer are formed independently from each other.

2. The manufacturing method of an electroluminescence element according to claim 1, discharging the fluid including the color changing constituent comprising discharging the fluid while adjusting a doping ratio of the color changing constituent of the fluid.

3. The manufacturing method of an electroluminescence element according to claim 1, said color changing constituent being selected from a group consisting of red color changing constituent, green color changing constituent and blue color changing constituent.

4. The manufacturing method of an electroluminescence element according to claim 3, the red color changing constituent having a chemical composition comprising one of a cyanine-based pigment, a pyridine-based pigment, a xanthene-based pigment, and an oxadine-based pigment.

5. The manufacturing method of an electroluminescence element according to claim 3, the red color changing constituent having a chemical composition prepared by dispersing (a) a rhodamine-based fluorescent pigment, and (b) a fluorescent pigment which absorbs rays in a blue region and induces energy transfer or re-absorption to said rhodamine-based fluorescent pigment into a light transmitting medium.

6. The manufacturing method of an electroluminescence element according to claim 3, the green color changing constituent having a chemical composition comprising a stilbene-based compound and a coumarin-based compound.

7. The manufacturing method of an electroluminescence element according to claim 3, the blue color changing constituent having a chemical composition comprising a coumarin pigment.

8. The manufacturing method of an electroluminescence element according to claim 1, further comprising after forming the color changing media, forming a light emitting layer by coating or by vapor deposition on an upper side of the color changing media.

9. A manufacturing method of an electroluminescence element comprising:

forming a plurality of anodes;

forming a plurality of partitioning members, said partitioning members forming a plurality of pixel openings above said anodes;

discharging a fluid including a color changing constituent toward each of said plurality of pixel openings with a liquid drop discharge head to cover said anodes with said fluid;

solidifying the fluid to form a color changing media in the openings;

disposing a light emitting layer that causes a light to be emitted, a wavelength of the light being converted by the color changing media; and disposing a cathode over said light emitting layer;

wherein the color changing media and light emitting layer are formed independently from each other.

10. The manufacturing method of an electroluminescence element according to claim 9, discharging the fluid including the color changing constituent comprising discharging the fluid while adjusting a doping ratio of the color changing constituent of the fluid.

11. The manufacturing method of an electroluminescence element according to claim 9, said color changing constituent being conductive and being a color changing constituent selected from a group consisting of red color changing constituent, green color changing constituent and blue color changing constituent.

12. The manufacturing method of an electroluminescence element according to claim 9, further comprising after forming the color changing media, forming a light emitting layer by coating or by vapor deposition on an upper side of the color changing media.

13. The manufacturing method of an electroluminescence element according to claim 9, a contact angle between a material composing a nozzle surface of said liquid drop discharge head and the fluid including the color changing constituent being within a range from 30 to 170 deg.

14. The manufacturing method of an electroluminescence element according to claim 9, the fluid including the color changing constituent having a viscosity within a range from 1 to 20 mPas.

15. The manufacturing method of an electroluminescence element according to claim 1, the fluid including the color changing constituent having a surface tension within a range from 20 to 70 dynes/cm.

16. The manufacturing method of an electroluminescence element according to claim 1, said liquid drop discharge head comprising a pressurizing chamber substrate having a pressurizing chamber which stores said fluid including the color changing constituent and a piezo-electric thin film element attached to a position permitting application of a pressure to said pressurizing chamber.

17. An electroluminescence element comprising:

a light emitting layer that emits light;

an anode and cathode arranged with said light emitting layer in between to form a pixel region;

partitioning members having a plurality of pixel openings at a position to which said pixel region corresponds;

a color changing media, discharged and solidified in each of said plurality of openings, for wavelength-converting light emitted from said light emitting layer wherein the color changing media and the light emitting layer are independently positioned, the color changing media being positioned between the anode and the cathode, and the color changing media being positioned so as to convert the wavelength of light from the light emitting layer.

18. The electroluminescence element according to claim 17, said electroluminescence element having a lamination structure comprising the cathode, the light emitting layer, the color changing media and the anode.

19. The electroluminescence element according to claim 17, said color changing media being conductive and being color changing media selected from a group consisting of red color changing media, green color changing media and blue color changing media.

* * * * *